(12) United States Patent
Behera

(10) Patent No.: US 11,373,719 B1
(45) Date of Patent: Jun. 28, 2022

(54) CONTACT LAYER TRACES TO PROGRAM PROGRAMMABLE ROM

(71) Applicant: TEXAS INSTRUMENTS INCORPORATED, Dallas, TX (US)

(72) Inventor: Ayaskanta Behera, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/460,368

(22) Filed: Aug. 30, 2021

(51) Int. Cl.
  *G11C 17/12* (2006.01)
  *H01L 27/112* (2006.01)

(52) U.S. Cl.
  CPC ............ *G11C 17/12* (2013.01); *H01L 27/112* (2013.01)

(58) Field of Classification Search
  CPC ............................. G11C 17/12; H01L 27/112
  USPC .............................................. 365/103, 230.03
  See application file for complete search history.

(56) References Cited

U.S. PATENT DOCUMENTS

| | | | | |
|---|---|---|---|---|
| 9,373,395 B1* | 6/2016 | Augustine | ........... | G11C 11/1673 |
| 2016/0093351 A1* | 3/2016 | Jung | ..................... | G11C 13/004 |
| | | | | 365/158 |
| 2016/0093353 A1* | 3/2016 | Jung | ..................... | G11C 11/1659 |
| | | | | 365/158 |
| 2016/0093354 A1* | 3/2016 | Andre | ................. | G06F 11/1048 |
| | | | | 365/158 |
| 2021/0073619 A1* | 3/2021 | Wang | ..................... | G06N 3/0635 |
| 2021/0110854 A1* | 4/2021 | Ranjan | ..................... | G11C 7/12 |
| 2021/0407986 A1* | 12/2021 | Chien | ................. | H01L 27/0207 |

\* cited by examiner

*Primary Examiner* — Michael T Tran
(74) *Attorney, Agent, or Firm* — Brian D. Graham; Charles A. Brill; Frank D. Cimino

(57) ABSTRACT

A device includes a programmable ROM circuit, an address circuit, and a processor. The programmable ROM circuit includes multiple physically contiguous pairs of bit-cells, each pair of bit-cells includes an active layer trace extending continuously across both of the bit-cells, each pair of bit-cells comprises a shared contact layer point when the pair of bit-cells is programmed to a value of one and no shared contact layer point when the pair of bit-cells is programmed to a value of zero. The address circuit is coupled to the programmable ROM circuit and configured to address only a first bit-cell of each pair of bit-cells. The processor is coupled to the address circuit and the programmable ROM circuit and configured to use the address circuit to read data from one or more pairs of bit-cells of the programmable ROM circuit.

20 Claims, 4 Drawing Sheets

CONTACT LAYER TRACES TO PROGRAM PROGRAMMABLE ROM

BACKGROUND

A system on a chip (SoC) is an integrated circuit that includes components of an electronic system. These components may include, on a single substrate or microchip, a microcontroller, microprocessor or one or more processor cores; read-only memory (ROM) and random access memory (RAM) of various types; coprocessor circuits such as security circuits and graphics processing units (GPUs); analog interfaces; serial and parallel input/output ports; and ethernet, Wi-Fi, and cellular communication interfaces. An SoC may be coupled to external devices by the analog interfaces, the serial and/or parallel input/output ports, or the ethernet, Wi-Fi, and/or cellular communication interfaces.

SUMMARY

In examples, a device includes a programmable ROM circuit, an address circuit, and a processor. The programmable ROM circuit includes multiple physically contiguous pairs of bit-cells, each pair of bit-cells includes an active layer trace extending continuously across both of the bit-cells of the pair of bit-cells, each pair of bit-cells comprises a contact layer point shared among the bit-cells in the pair when each bit-cell in the pair is programmed to a value of one and no contact layer point shared among the bit-cells in the pair when each bit-cell in the pair is programmed to a value of zero. The address circuit is coupled to the programmable ROM circuit and configured to address only a first bit-cell of each pair of bit-cells. The processor is coupled to the address circuit and the programmable ROM circuit and configured to use the address circuit to read data from one or more pairs of bit-cells of the programmable ROM circuit.

In another example, a device includes a programmable ROM circuit, an address circuit, and a processor. The programmable ROM circuit includes a first plurality of bit-cells that include multiple non-overlapping single-cell byte-subsets of the bit-cells, each single-cell byte-subset including m bit-cells, and a second plurality of bit-cells that include multiple physically contiguous pairs of bit-cells, each pair of bit-cells including an active layer trace extending continuously across both of the bit-cells of the pair of bit-cells. Each pair of bit-cells of the second plurality of bit-cells includes a contact layer point shared among the bit-cells in the pair when each bit-cell in the pair is programmed to a value of one and no contact layer point shared among the bit-cells in the pair when each bit-cell in the pair is programmed to a value of zero. The multiple physically contiguous pairs of bit-cells include a plurality of non-overlapping paired-cell byte-subsets of the pairs of bit-cells and each paired-cell byte-subset includes n pairs of bit-cells. The address circuit is coupled to the programmable ROM circuit and is configured to address simultaneously the bit-cells of a selected single-cell byte-subset or only a first bit-cell of each pair of bit-cells of a selected paired-cell byte-subset. The processor is coupled to the address circuit and the programmable ROM circuit and is configured to use the address circuit to read data from the selected single-cell byte-subset or selected paired-cell byte-subset of the programmable ROM circuit.

In a further example, a method includes initiating fabrication of a first SoC based on a first GDSII chip layout file, the first GDSII chip layout file defining the first SoC as including a programmable ROM circuit. The programmable ROM circuit includes multiple physically contiguous pairs of bit-cells, each pair of bit-cells including an active layer trace that extends continuously across both of the bit-cells of the pair of bit-cells, and each pair of bit-cells includes a contact layer point shared among the bit-cells in the pair when each bit-cell in the pair is programmed to a value of one and no contact layer point shared among the bit-cells in the pair when each bit-cell in the pair is programmed to a value of zero. The method further includes testing the first SoC and, in response to determining that firmware of the first SoC should be changed, halting fabrication of the first SoC and generating a new ROM image. The method further includes initiating generation of a second GDSII chip layout file defining a second SoC that differs from the first GDSII chip layout file at least in locations of the shared contact layer points of the pairs of bit-cells of the programmable ROM circuit in the first SoC and in the second SoC, and initiating fabrication of the second SoC based on the second GDSII chip layout file.

BRIEF DESCRIPTION OF THE DRAWINGS

For a detailed description of various examples, reference will now be made to the accompanying drawings in which.

DETAILED DESCRIPTION

An SoC includes ROM programmed during fabrication with some functionality of the SoC. The functionality may include basic functions, such as an operating system, communication protocols, or loading additional programs from an external source to add higher level functionality to the SoC. Some SoCs are designed to operate as standalone devices and the ROMs of such SoCs include firmware for higher level functionality.

After an SoC design is completed, fabrication of the SoC is initiated. The fabricated devices are tested to confirm that, as manufactured, the devices function according to requirements and the design. If problems are found with the fabricated devices, fabrication is halted while changes are made to the hardware and/or firmware of the SoC to correct the problems. Where the changes are only to the firmware, only the ROM design of the SoC is modified to include the changed firmware and fabrication is reinitiated to build SoCs according to the new design. Some partially fabricated SoCs of the first design may be discarded, representing significant opportunity costs and efficiency losses. In addition, the fabrication system may stand idle while the firmware and the ROM design are changed, negatively impacting production and revenue.

Bit-cells of one type of ROM technology are programmed to values of 1 (one) and 0 (zero) by configuration of both an active layer and a contact layer of the ROM circuit. Such bit-cell structures may be used to maximize bit-cell density. However, it may be desirable in some applications for bit-cells to be programmed by configuration of only the contact layer of the ROM circuit despite any potential impact on bit-cell density.

In various embodiments of the present disclosure, programmable ROM circuits have at least some bit-cells with active layer configurations that allow the ROM circuits to be programmed to values of 1 (one) and 0 (zero) by configuration of the contact layers of the ROM circuits. This allows for quicker design turnaround of a new ROM design that has changed firmware, permitting fabrication to resume more quickly. Furthermore, in a fabrication process where the contact layer of the ROM circuit is deposited after the active layer, partially fabricated SoCs of the previous ROM design that had not reached deposition of the contact layer of the old design may be used with the new ROM design by resuming fabrication using the contact layer of the new design, thus reducing the number of partially fabricated SoCs of the first design that may be discarded.

Figure 1:
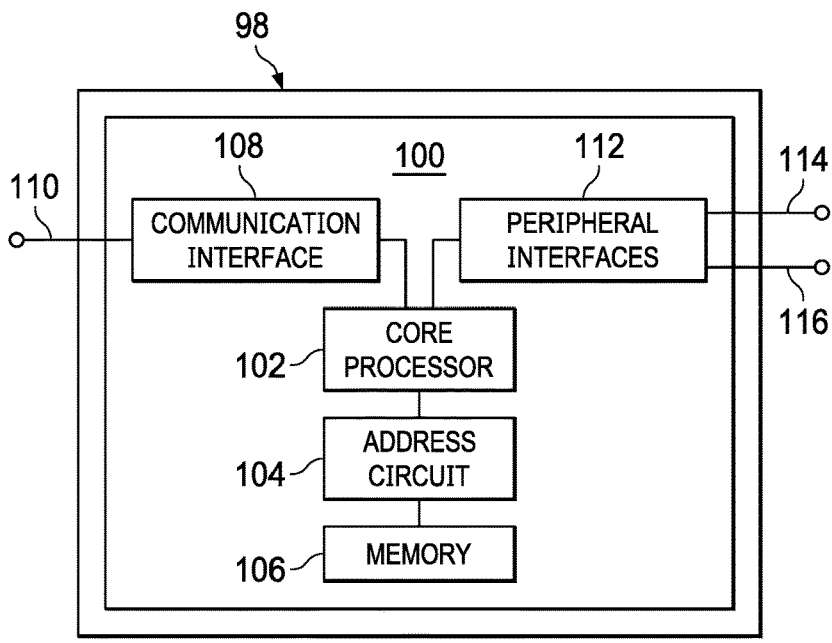
FIG. 1 is a block diagram of an SoC in accordance with various examples.

FIG. 1 is a block diagram of an SoC 100 in accordance with various examples. The SoC 100 is part of an electronic device 98, which may be an embedded system in an appliance, automobile, or aircraft. In other applications, the electronic device 98 comprising the SoC 100 may be a mobile computing device, such as a watch, smartphone, tablet, laptop, or desktop computer. The SoC 100 includes a core processor 102 coupled via an address circuit 104 to a memory 106. The memory 106 is configured to store instructions that, when executed by the core processor 102, cause the core processor 102 to perform the various functionality described herein. The memory 106 is one example of a non-transitory, computer-readable medium. Either or both of the core processor 102 and the memory 106 may include programmable ROM memory circuits according to the disclosure.

The core processor 102 is also coupled via a communication interface 108 to one or more communication links 110 to facilitate communication with other devices. The core processor 102 is further coupled to peripheral interface circuits 112 for connection to external devices via analog link 114 and/or serial link 116. The analog link 114 and the serial link 116 may represent a plurality of analog or serial links, respectively. The SoC 100 includes other circuits and processors that are not shown in FIG. 1 in order to simplify explanation.

Figure 2:
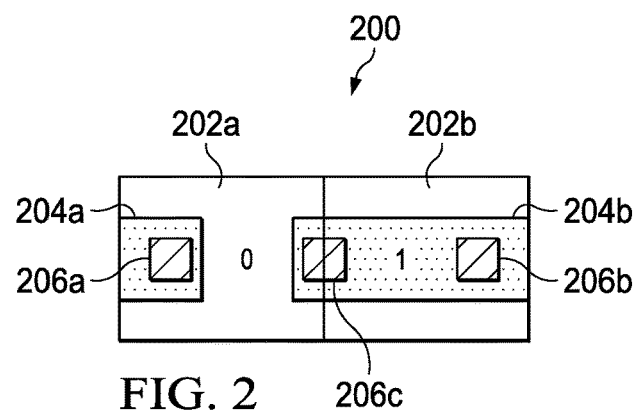
FIGS. 2-4 are schematic diagrams of bit-cells of ROM memory.
Figure 3:
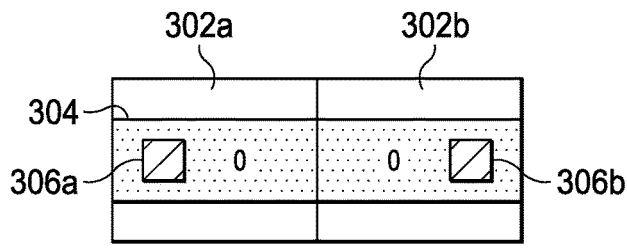
Figure 4:
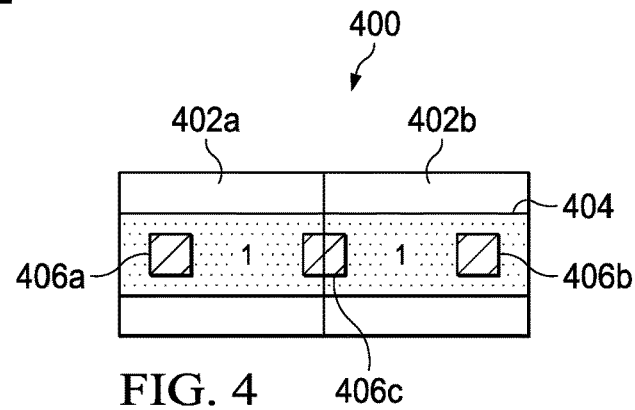

FIGS. 2-4 are schematic diagrams of bit-cells in ROM memory. Specifically, FIGS. 2-4 show bit-cells of a programmable ROM memory circuit. A bit-cell of ROM memory is read by sensing a voltage across the bit-cell. In one example, a ROM memory with an inverting bit sense amplifier reads a value 1 when the voltage sensed across the bit-cell is 0 volts and a value 0 when the voltage sensed across the bit-cell is 1.2 volts.

FIG. 2 shows bit-cells 200, identified individually as bit-cell 202a and bit-cell 202b. A portion 204a of an active layer trace extends into the bit-cell 202a. A portion 204b of the active layer trace extends across the bit-cell 202b and over the shared contact layer point 206c. There are three contact layer points 206a-c in the bit-cells 202a and 202b. The contact layer point 206a is located wholly within the bit-cell 202a, but in other embodiments may be located partially in the bit-cell 202a and partially in an adjacent bit-cell (not shown) that abuts the left side of the bit-cell 202a. The contact layer point 206b is located wholly within the bit-cell 202b but, as with the contact layer point 206a, may be located partially within the bit-cell 202b and partially within an adjacent bit-cell (not shown) that abuts the right side of the bit-cell 202b. The contact layer point 206c is located partially within each of the bit-cells 202a and 202b and is referred to herein as 'shared' between the bit-cells 202a and 202b. The bit-cell 202a has two contact layer points (206a and 206c) and discontinuous portions (204a and 204b) of the active layer trace and is thereby programmed to the value 0. The bit-cell 202b has two contact layer points (206b and 206c) and continuous portion 204b of the active layer trace and is thereby programmed to the value 1.

FIG. 3 shows bit-cells 300, identified individually as bit-cell 302a and bit-cell 302b. An active layer trace 304 extends across both the bit-cells 302a and 302b. There is one contact layer point 306a in the bit-cell 302a and one contact layer point 306b in the bit-cell 302b. The contact layer points 306a and 306b are located wholly within the bit-cells 302a and 302b, respectively, in FIG. 3. However, as described for contact layer points 206a and 206b above, in other embodiments the contact layer points 306a and 306b may be partially located within bit-cells (not shown) adjacent to the bit-cells 302a and 302b. The presence of a single contact layer point (306a and 306b) in the bit-cells 302a and 302b, respectively, and a continuous active layer trace 304 extending across both bit-cells 302a and 302b results in both bit-cells 302a and 302b being programmed to the value 0.

FIG. 4 shows bit-cells 400, identified individually as bit-cell 402a and bit-cell 402b. An active layer trace 404 extends across both the bit-cells 402a and 402b. There is one contact layer point 406a in the bit-cell 402a and one contact layer point 406b in the bit-cell 402b. The contact layer points 406a and 406b are located wholly within the bit-cells 402a and 402b, respectively, in FIG. 4. However, as described for contact layer points 206a and 206b and contact layer points 306a and 306b above, in other embodiments the contact layer points 406a and 406b may be partially located within bit-cells (not shown) adjacent to the bit-cells 402a and 402b. There is also a shared contact layer point 406c located partially within each of the bit-cells 402a and 402b. The presence of a shared contact layer point 406c between the bit-cells 402a and 402b, with a continuous active layer trace 404 extending across both bit-cells 402a and 402b results in both bit-cells 402a and 402b being programmed to the value 1.

FIGS. 2-4 illustrate that a bit-cell of a programmable ROM memory circuit may be programmed to 0 in either of two ways: (i) by depositing a non-continuous active layer trace across two contact layer points in the bit-cell or (ii) by depositing a continuous active layer trace across a bit-cell having only a single contact layer point. A bit-cell of a programmable ROM memory circuit may be programmed to 1 in one way: by depositing a continuous active layer trace across a bit-cell having two contact layer points. The particular way that a given bit-cell of programmable ROM is programmed to a 1 or 0 (e.g., the physical arrangement of the active layer and contact layer portions) may depend on both the value of the given bit-cell and the value of an adjacent bit-cell. In that regard, as shown more clearly in FIGS. 5-7, in cells programmed to either 0 or 1, contact layer points may be shared between adjacent bit-cells.

By designing pairs of bit-cells with depositing a continuous active layer trace across both bit-cells of the pair, programmable ROM circuits may be programmed by configuring the contact layer points of the ROM circuits without changing the active layer traces. Thus, the time required to turn around a new ROM design having changed firmware is reduced, permitting fabrication to resume more quickly. Furthermore, in a fabrication process where the contact layer of the ROM circuit is deposited after the active layer, partially fabricated SoCs of the previous ROM design that had not reached the stage of depositing the contact layer may be used with the new ROM design by resuming fabrication by depositing the contact layer of the new design, thus reducing the number of partially fabricated SoCs of the first design that may be discarded.

Figure 5:
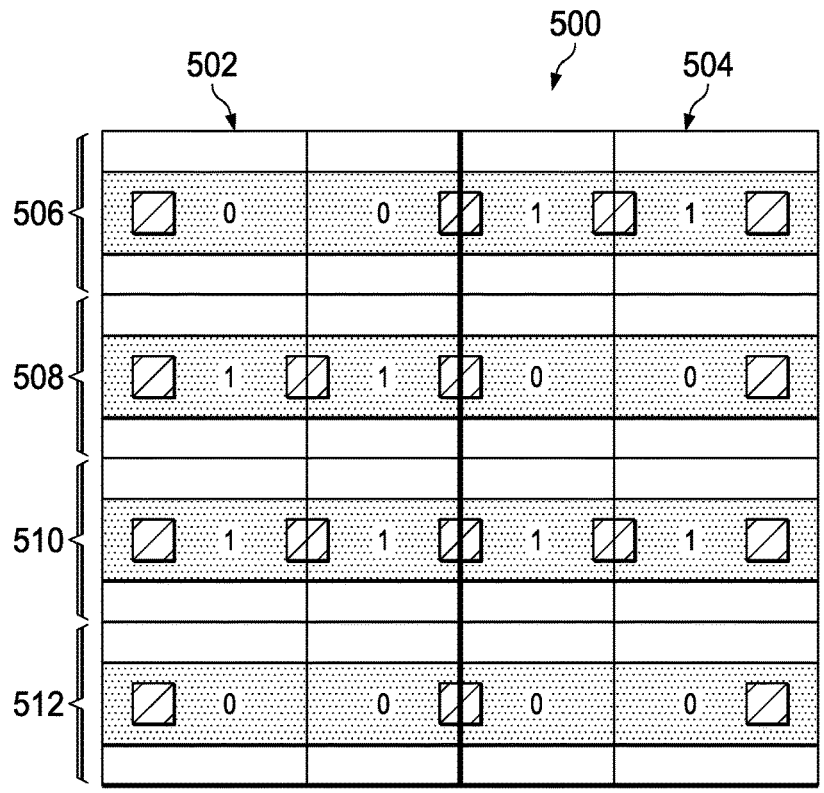
FIG. 5 is a schematic diagram of a block of ROM memory comprising byte-subsets of bit-cell pairs in accordance with various examples.

FIG. 5 is a schematic diagram of a block 500 of ROM memory comprising byte-subsets of bit-cell pairs in accordance with various examples. Each bit-cell pair is included in only one byte-subset, and thus the byte-subsets may be referred to as 'non-overlapping byte-subsets.' The block 500 shows a portion of a programmable ROM memory circuit according to the disclosure. The block 500 includes two byte-subsets 502 and 504, each comprising four bit-cell pairs. The four bit-cell pairs in each byte-subset 502 and 504 are arranged in columns and the two byte-subsets 502 and 504 are arranged in a byte-subset row. Horizontally adjacent bit-cell pairs in the byte-subsets 502 and 504 form bit-pair rows 506, 508, 510, and 512.

A continuous active layer trace extends across both bit-cells of each bit-pair row 506, 508, 510, and 512. As FIG. 5 indicates, the bit-pairs that include two contact layer points (whether shared or non-shared) are programmed to a value of 1, while the bit-pairs that include only one contact layer point (whether shared or non-shared) are programmed to a value of 0.

Figure 6:
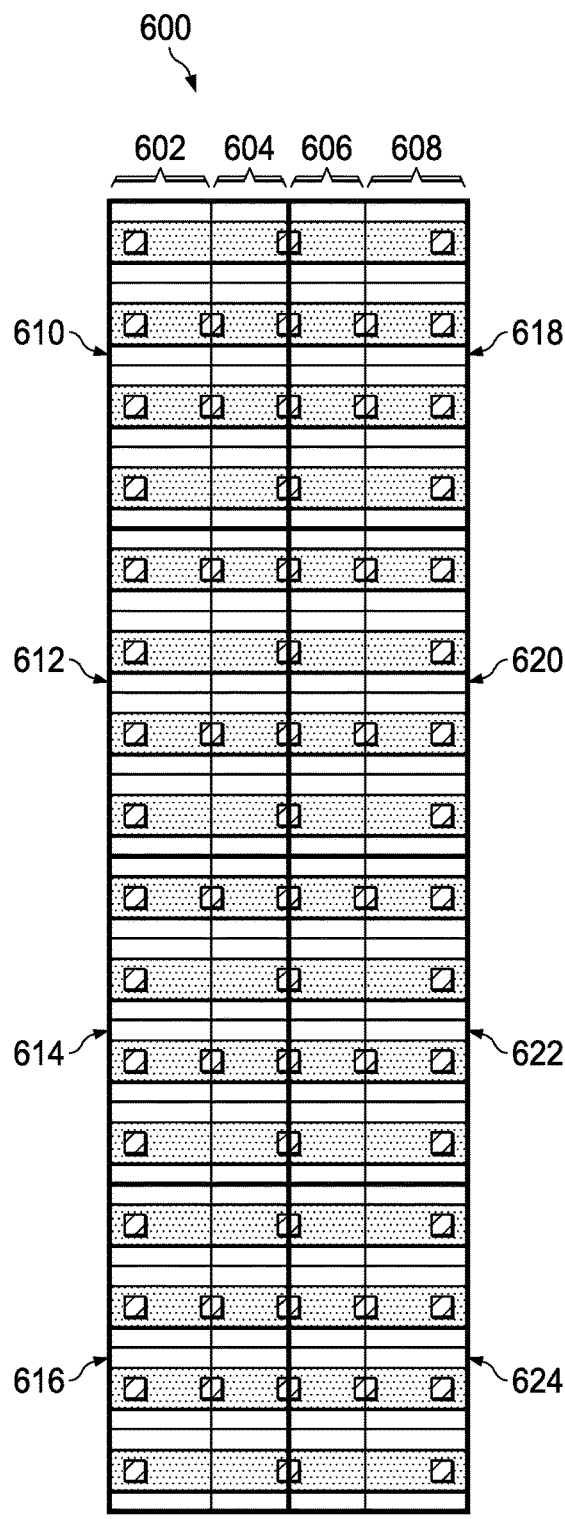
FIG. 6 is a schematic diagram of a first ROM memory circuit in accordance with various examples.

FIG. 6 shows a schematic view of a first ROM memory circuit 600 in accordance with various examples. The first ROM memory circuit 600 is a ROM programmable memory circuit. The bit-cells of the ROM memory circuit 600 may be structured in two different ways, as individual and independent bit-cells or as pairs in which each bit-cell of the pair stores the same value. In an example of the first way, the first ROM memory circuit 600 provides sixty-four bit-cells—sixteen bit-cells in each of columns 602, 604, 606, and 608, if used as a conventional ROM memory circuit. Such bit-cells could be individually addressed at 0000-0015, 0016-0031, 0032-0047, and 0048-0063 in the columns 602, 604, 606, and 608, respectively. In some alternative systems, the sixty-four bit-cells might be addressed as sixteen four-bit ROM cells—four four-bit ROM cells each in the four columns 602, 604, 606, and 608. An address circuit might address the four-bit ROM cells at processor addresses 0000-0003, 0004-0007, 0008-0011, and 00012-0015 in the columns 602, 604, 606, and 608, respectively.

In contrast, as described above, the first ROM memory circuit 600 may also be configured as pairs of bit-cells programmed to store a single bit of data—a value of 1 or 0 based on the presence or absence, respectively, of a shared contact layer point between the bit-cells of the pair. The paired bit-cells in the columns 602 and 604 form a first group of four four-bit byte-subsets, 610, 612, 614, and 616. The paired bit-cells in the columns 606 and 608 form a second group of four four-bit byte-subsets, 618, 620, 622, and 624.

In some embodiments, described with reference to the SoC 100 of FIG. 1, the core processor 102 reads four-bit bytes of the first ROM memory circuit 600 at processor addresses 0000-0007 via the address circuit 104. The address circuit 104 of the SoC 100 is configured to address only a first one of the bit-cells in a bit-cell pair of the first ROM memory circuit 600, for example, only the bit-cells in columns 602 and 606. The address circuit 104 translates the processor address 0000 as selecting the byte-subset 610 and addresses individual bit-cell addresses 0000-0003. Similarly, the address circuit 104 translates the processor address 0007 as selecting byte-subset 622 and addresses individual bit-cell addresses 0044-0047. In some embodiments, the core processor 102 simultaneously reads the addressed individual bit-cells of a selected byte-subset from the first ROM memory circuit 600.

Thus, the address circuit 104 addresses bit-cells 0000-0015 of a first group of four four-bit byte-subsets, 610, 612, 614, and 616, and bit-cells 0032-0047 of a second group of four four-bit byte-subsets, 618, 620, 622, and 624. In such an embodiment, the address circuit 104 does not address individual bit-cell addresses 0016-0031 and 0048-0063. Bit-cell addresses 0000-0015 are contiguous bit-cell addresses, bit-cell addresses 0032-0047 are contiguous bit-cell addresses, and the bit-cell address range 0000-0015 is discontiguous from the bit-cell address range 0032-0047.

Byte-subsets according to the disclosure may include any number of pairs of bit-pairs per byte-subset. Byte-subsets 502 and 504 of FIGS. 5 and 610, 612, 614, 616, 618, 620, 622, and 624 of FIG. 6 include four bit-pairs per byte-subset. However, in other embodiments, byte-subsets according to the disclosure may include n pairs of bit-pairs, where n is equal to eight or any other desired value. In the embodiments shown in FIGS. 5 and 6, the pairs of bit-cells of each byte-subset are arranged in columns, at least some of the byte-subsets are arranged in rows, and the active layer trace across a one pair of bit-cells of a byte-subset extends continuously across pairs of bit-cells of other byte-subsets in the row. In other embodiments, the pairs of bit-cells of each byte-subset may be arranged in a row and at least some of the byte-subsets may be arranged in one or more columns. While FIG. 6 shows the first ROM memory circuit 600 in an embodiment of the disclosure comprising eight byte-subsets (610, 612, 614, 616, 618, 620, 622, and 624), in other embodiments a programmable ROM memory circuit according to the disclosure may include sixteen, thirty-two, or any other desired number of byte-subsets.

Figure 7:
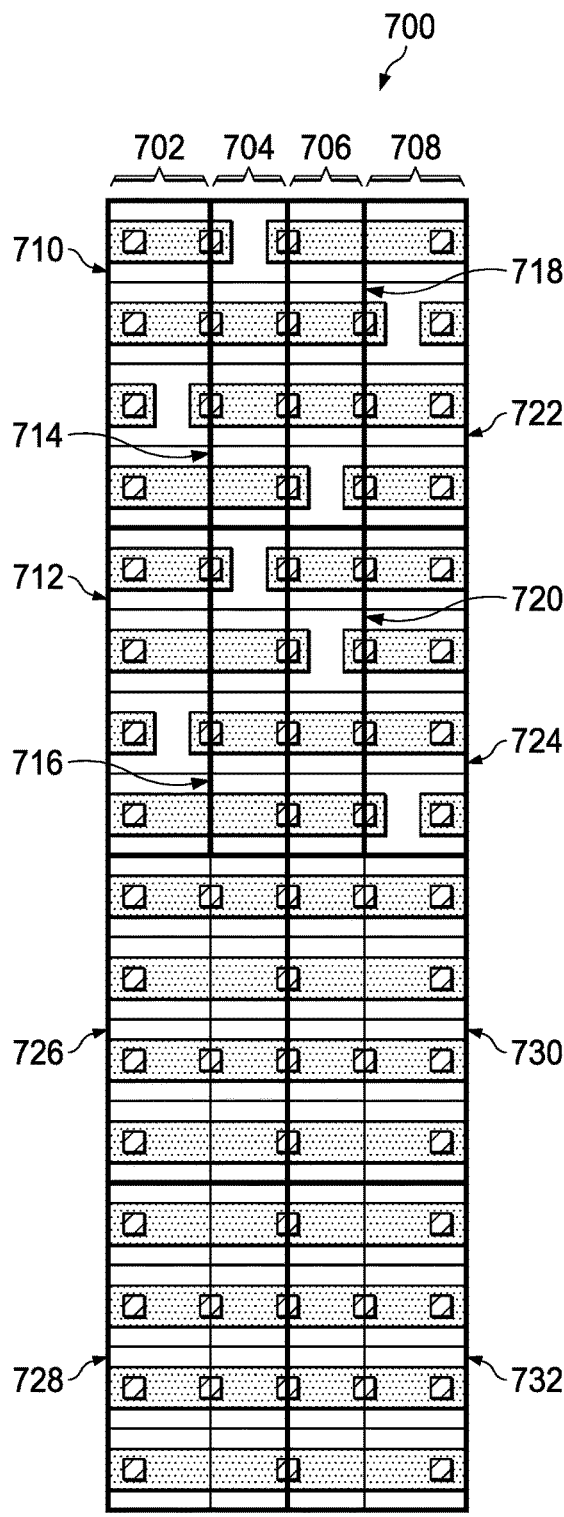
FIG. 7 is a schematic diagram of a second ROM memory circuit in accordance with various examples.

FIG. 7 shows a schematic view of a second ROM memory circuit 700 in accordance with various examples. Like the first ROM memory circuit 600, the second ROM memory circuit 700 is a ROM programmable memory circuit. Also like the first ROM memory circuit 600, if configured in a first way, the second ROM memory circuit 700 would provide sixty-four bit-cells-sixteen bit-cells in each of columns 702, 704, 706, and 708. Such bit-cells would be individually addressed at 0000-0015, 0016-0031, 0032-0047, and 0048-0063 in the columns 702, 704, 706, and 708, respectively.

Unlike the first ROM memory circuit 600, the second ROM memory circuit 700 is configured as a hybrid ROM circuit comprising both single-cell byte-subsets (710, 712, 714, 716, 718, 720, 722 and 724), each comprising four individual bit-cells and paired-cell byte-subsets (726, 728, 730, and 732), each comprising four bit-cell pairs. As described above, each bit-cell pair is included in only one paired-cell byte-subset, and thus the paired-cell byte-subsets may be referred to as 'non-overlapping paired-cell byte-subsets'. Similarly, each individual bit-cell of a single-cell byte-subset is included in only one single-cell byte-subset, and thus the single-cell byte-subsets may be referred to as 'non-overlapping single-cell byte-subsets.'

As described herein, when testing of SoC designs reveals that firmware should be changed, paired bit-cells of a ROM programmable memory circuit according to the disclosure may provide a quicker turnaround and reduced wastage of partially fabricated chips. By designing pairs of bit-cells with depositing a continuous active layer trace across both bit-cells of the pair, programmable ROM circuits may be reprogrammed by reconfiguring the contact layer points of the ROM circuits without changing the active layer traces. Thus the time required to turn around a new ROM design having changed firmware is reduced, permitting fabrication to resume more quickly. Furthermore, in a fabrication process where the contact layer of the ROM circuit is deposited after the active layer, partially fabricated SoCs of the previous ROM design that had not reached the stage of depositing the contact layer may be used with the new ROM design by resuming fabrication by depositing the contact layer of the new design, thus reducing the number of partially fabricated SoCs of the first design that may be discarded.

In some applications, some of the firmware in the SoC may be well-tested and unlikely to be revised during testing. Because single-cell byte-subsets provide more efficient storage of data than paired-cell byte-subsets (one bit-cell per bit of data, rather than two bit-cells per bit of data), SoC developers may consider that such well-tested firmware may be suitable for programming into single-cell byte-subsets. The second ROM memory circuit 700 provides for storage of twelve four-bit bytes of data, compared to the eight four-bit bytes of data stored by the first ROM memory circuit 600.

TABLE 1

| Proc. Addr. | Byte-Subset | Bit-Cell Addrs. | Byte Value |
|---|---|---|---|
| 0000 | 710 | 0000-0003 | 1100 |
| 0001 | 712 | 0004-0007 | 1000 |
| 0002 | 714 | 0016-0019 | 0110 |
| 0003 | 716 | 0020-0023 | 0010 |
| 0004 | 718 | 0032-0035 | 0110 |
| 0005 | 720 | 0036-0039 | 1011 |
| 0006 | 722 | 0048-0051 | 0011 |
| 0007 | 724 | 0052-0055 | 1110 |
| 0008 | 726 | 0008-0011 | 1010 |
| 0009 | 728 | 0012-0015 | 0110 |
| 0010 | 730 | 0040-0043 | 1010 |
| 0011 | 732 | 0044-0047 | 0110 |

Table 1 shows, for the embodiment illustrated in FIG. 7, a mapping by the address circuit 104 to processor addresses, single-cell/paired-cell byte-subsets, and bit-cell addresses. Table 1 also shows a binary byte value stored in each single-cell or paired-cell byte-subset shown in FIG. 7.

As shown in Table 1, the core processor 102 reads selected four-bit bytes of the second ROM memory circuit 700 at processor addresses 0000-00011 via the address circuit 104. The address circuit 104 of the SoC 100 is configured to address the single-cell byte-subsets 710, 712, 714, 716, 718, 720, 722 and 724 at processor addresses 0000-0007 and the paired-cell byte-subsets 726, 728, 730, and 732 at processor addresses 0008-0011. As an example, when the core processor 102 reads from the processor address 0000, the address circuit 104 selects single-cell byte-subset 710 and addresses individual bit-cell addresses 0000-0003.

The address circuit 104 of the SoC 100 is configured to address only a first one of the bit-cells in the paired-cell byte-subsets 726, 728, 730, and 732, for example, only the bit-cells in columns 702 and 706. As an example, when the core processor 102 reads from the processor address 0008, the address circuit 104 selects paired-cell byte-subset 726 and addresses individual bit-cell addresses 0008-0011. Similarly, when the core processor 102 reads from the processor address 0011, the address circuit 104 selects paired-cell byte-subset 732 and addresses individual bit-cell addresses 0044-0047. In some embodiments, the core processor 102 simultaneously reads the addressed bits from the selected single-cell byte-subset or the selected paired-cell byte-subset of the second ROM memory circuit 700.

Thus, the address circuit 104 addresses bit-cells 0008-0015 of a first group of two four-bit paired-cell byte-subsets, 726 and 728, and bit-cells 0040-0047 of a second group of two four-bit paired-cell byte-subsets, 730 and 732. In such an embodiment, the address circuit 104 does not address individual bit-cell addresses 0024-0031 and 0056-0063. Bit-cell addresses 0008-0015 are contiguous bit-cell addresses, bit-cell addresses 0040-0047 are contiguous bit-cell addresses, and the bit-cell address range 0008-0015 is discontiguous from the bit-cell address range 0040-0047.

Single-cell byte-subsets 710, 712, 714, 716, 718, 720, 722 and 724 and paired-cell byte-subsets 726, 728, 730, and 732 each comprise four bit-cells and four paired bit-cells, respectively. In other embodiments, single-cell byte-subsets according to the disclosure may include m bit-cells, where m is equal to eight or any other desired value. In still other embodiments, paired-cell byte-subsets according to the disclosure may include n bit-cells, where n is equal to eight or any other desired value. In the embodiment shown in FIG. 7, the bit-cells of each single-cell byte-subset 710, 712, 714, 716, 718, 720, 722 and 724 and the pairs of bit-cells of each paired-cell byte-subset 726, 728, 730, and 732 are arranged in columns, at least some of the single-cell byte-subsets 710, 712, 714, 716, 718, 720, 722 and 724 and paired-cell byte-subsets 726, 728, 730, and 732 are arranged in rows, and the active layer trace across a first pair of bit-cells of a paired-cell byte-subset 726, 728, 730, and 732 extends continuously across a second pair of bit-cells of another paired-cell byte-subset 726, 728, 730, and 732 in the row. In other embodiments, the bit-cells of each single-cell byte-subset and the pairs of bit-cells of each paired-cell byte-subset may be arranged in a row and at least some of the single-cell byte-subsets and paired-cell byte-subsets are arranged in one or more columns. While FIG. 7 shows the second ROM memory circuit 700 in an embodiment of the disclosure comprising eight single-cell byte-subsets 710, 712, 714, 716, 718, 720, 722 and 724 and four paired-cell byte-subsets 726, 728, 730, and 732, in other embodiments a programmable ROM memory circuit according to the disclosure may include any other desired numbers of single-cell byte-subsets and paired-cell byte-subsets.

Figure 8:
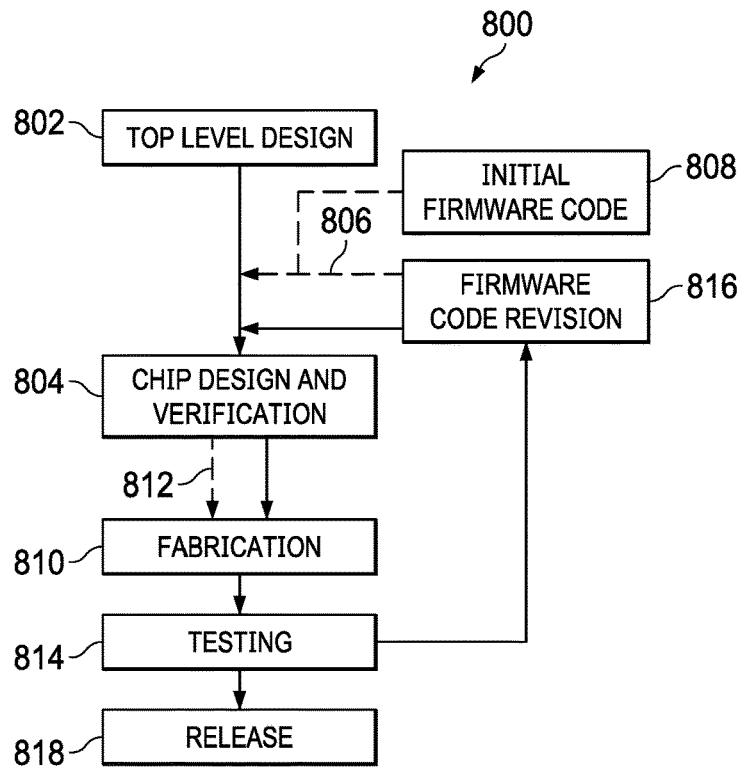
FIG. 8 is a flow diagram of an SoC development process in accordance with various examples.

FIG. 8 is a flow diagram of an SoC development process 800 in accordance with various examples. The development process 800 is an overview intended to provide context for the method 900 for fabricating an SoC shown in FIG. 9. Process flow between steps is indicated in FIG. 8 by solid lines and data flow by dashed lines. In step 802, a top level design process is performed based on information including system requirements. In step 804, chip design and verification is performed based on specifications produced by the top level design process of step 802 and a ROM image 806 produced in step 808 from initial firmware code.

SoC fabrication is initiated in step 810, based on a first Graphic Design System Information Interchange (GDSII) chip layout file 812 received from the chip design process of step 804. The chip design process defines a programmable ROM memory circuit and address circuit according to the disclosure, such as the ROM memory circuit 600 according to the disclosure and the address circuit 104 described above.

As the fabrication process initiated in step 810 begins producing first SoCs, testing of the first SoCs is performed in step 814. In response to the testing determining that the initial firmware of the SoCs should be changed, the fabrication process initiated in step 810 is halted and firmware code revision is performed in step 816, generating a new ROM image 806. The chip design and verification process of step 804 is repeated, using the new ROM image 806 to generate a second GDSII chip layout file 812.

The fabrication process of step 810 is initiated again, beginning production of second SoCs based on the second GDSII chip layout file. If testing of the second SoCs in step 814 determines that no further change is needed to the firmware of the SoCs, the development process 800 terminates in step 818 with release of the second SoCs.

Figure 9:
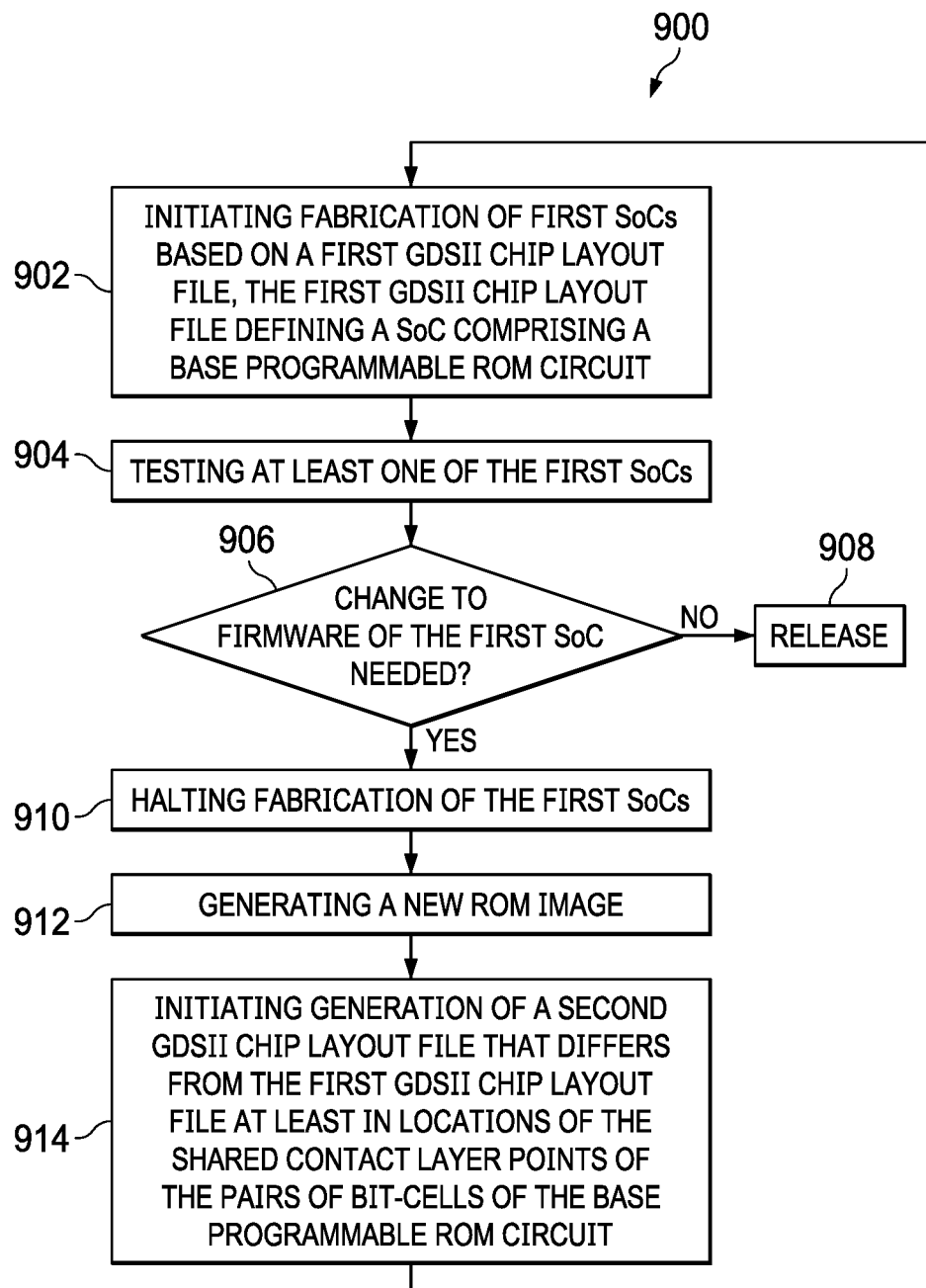
FIG. 9 is a flow diagram of a method for fabricating an SoC in accordance with various examples.

FIG. 9 is a flow diagram of a method 900 for fabricating an SoC in accordance with various examples. In step 902, fabrication of first SoCs is initiated, based on a first GDSII chip layout file. The first GDSII chip layout file defines an SoC that comprises a programmable ROM circuit that includes a plurality of bit-cells, arranged in physically adjacent pairs of bit-cells, each pair of bit-cells including a continuous active layer trace across both of the bit-cells of the pair. Each pair of bit-cells comprises a shared contact layer point when the pair of bit-cells is programmed to a value of one and no shared contact layer point when the pair of bit-cells is programmed to a value of zero.

In step 904, at least one of the first SoCs is tested and, in step 906, it is determined whether the firmware of the first SoCs should be changed. If no change to the firmware of the first SoCs is needed, then the method 900 terminates in step 908 with the SoCs being released and the fabrication of first SoCs initiated in step 902 continuing. However, if it is determined in step 906 that the firmware of the first SoCs should be changed, then in step 910 the fabrication of first SoCs initiated in step 902 is halted.

In step 912, the SoC firmware is revised and a new ROM image is generated that includes the changes to the firmware. In step 914, generation of a second GDSII chip layout file is initiated. The second GDSII chip layout file differs from the first GDSII chip layout file at least in locations of the shared contact layer points of the pairs of bit-cells of the programmable ROM circuit of the SoC. In some embodiments, the only difference between the second GDSII chip layout file and the first GDSII chip layout file is the locations of the shared contact layer points.

After step 914, the method 900 goes back to step 902, where fabrication of second SoCs is initiated, based on the second GDSII chip layout file. The method 900 continues, looping back from step 914 to step 902, until terminated in step 908.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including a processor, communication interface, and memory may instead include only the processor and may be adapted to be coupled to either one or both of the communication interface and memory to form the described structure either at a time of manufacture or after a time of manufacture, for example, by an end-user and/or a third-party.

What is claimed is:

1. A device comprising:
    a programmable read-only memory (ROM) circuit, comprising:
        physically contiguous pairs of bit-cells, each pair of bit-cells including an active layer trace extending continuously across both of the bit-cells of the pair of bit-cells, wherein the pairs of bit-cells include:
            a first pair of bit-cells comprising a contact layer point shared among the bit-cells in the first pair such that each bit-cell in the pair is programmed to a value of one; and
            a second pair of bit-cells that comprises no contact layer point shared among the bit-cells in the second pair such that each bit-cell in the pair is programmed to a value of zero;
    an address circuit coupled to the programmable ROM circuit and configured to address only a first bit-cell of each pair of bit-cells; and
    a processor coupled to the address circuit and the programmable ROM circuit, the processor configured to use the address circuit to read data from the pairs of bit-cells of the programmable ROM circuit.

2. The device of claim 1, wherein:
    the multiple physically contiguous pairs of bit-cells comprise a plurality of non-overlapping byte-subsets of the pairs of bit-cells, each byte-subset comprising n pairs of bit-cells;
    the address circuit is configured to address simultaneously the first bit-cell of each pair of bit-cells in a selected byte-subset; and
    the processor is configured to read data simultaneously from the first bit-cell of each pair of bit-cells in the selected byte-subset.

3. The device of claim 2, wherein the pairs of bit-cells of at least one byte-subset are arranged in a column.

4. The device of claim 3, wherein two or more of the plurality of byte-subsets are arranged in a row.

5. The device of claim 4, wherein the active layer trace across both of the bit-cells of a first pair of bit-cells of a first byte-subset in the row extends continuously across both of the bit-cells of a second pair of bit-cells of a second byte-subset in the row.

6. The device of claim 2, wherein the number n of pairs of bit-cells of at least one byte-subset is four.

7. The device of claim 6, wherein the programmable ROM circuit comprises one of sixteen byte-subsets and thirty-two byte-subsets.

8. The device of claim 2, wherein:
    the programmable ROM circuit comprises a first group of byte-subsets and a second group of byte-subsets;

bit-cell addresses of the first bit-cell of each pair of bit-cells of the first group of byte-subsets are contiguous;

bit-cell addresses of the first bit-cell of each pair of bit-cells of the second group of byte-subsets are contiguous; and a first bit-cell address range of the first bit-cell of each pair of bit-cells of the first group of byte-subsets is discontiguous from a second bit-cell address range of the first bit-cell of each pair of bit-cells of the second group of byte-subsets.

9. A device comprising:

a programmable read-only memory (ROM) circuit, comprising:

a first plurality of bit-cells comprising multiple non-overlapping single-cell byte-subsets of the bit-cells, each single-cell byte-subset comprising m bit-cells;

a second plurality of bit-cells comprising multiple physically contiguous pairs of bit-cells, each pair of bit-cells including an active layer trace extending continuously across both of the bit-cells of the pair of bit-cells;

a first pair of bit-cells comprising a contact layer point shared among the bit-cells in the first pair such that each bit-cell in the pair is programmed to a value of one; and a second pair of bit-cells that comprises no contact layer point shared among the bit-cells in the second pair such that each bit-cell in the pair is programmed to a value of zero;

the multiple physically contiguous pairs of bit-cells comprising a plurality of non-overlapping paired-cell byte-subsets of the pairs of bit-cells, each paired-cell byte-subset comprising n pairs of bit-cells;

an address circuit coupled to the programmable ROM circuit and configured to address simultaneously the bit-cells of a selected single-cell byte-subset or only a first bit-cell of each pair of bit-cells of a selected paired-cell byte-subset; and a processor coupled to the address circuit and the programmable ROM circuit, the processor configured to use the address circuit to read data from the selected single-cell byte-subset or selected paired-cell byte-subset of the programmable ROM circuit.

10. The device of claim 9, wherein the bit-cells of at least one single-cell byte-subset are arranged in a first column and the pairs of bit-cells of at least one paired-cell byte-subset are arranged in a second column.

11. The device of claim 10, wherein two or more of the single-cell byte-subsets are arranged in a first row and two or more of the paired-cell byte-subsets are arranged in a second row.

12. The device of claim 11, wherein the active layer trace across both of the bit-cells of a first pair of bit-cells of a first paired-cell byte-subset in the second row extends continuously across both of the bit-cells of a second pair of bit-cells of a second paired-cell byte-subset in the second row.

13. The device of claim 9, wherein the number m of bit-cells of at least one single-cell byte-subset is four or the number n of pairs of bit-cells of at least one paired-cell byte-subset is four.

14. The device of claim 9, wherein:

the programmable ROM circuit comprises a first group of paired-cell byte-subsets and a second group of paired-cell byte-subsets;

bit-cell addresses of the first bit-cell of each pair of bit-cells of the first group of paired-cell byte-subsets are contiguous and bit-cell addresses of the first bit-cell of each pair of bit-cells of the second group of paired-cell byte-subsets are contiguous; and a first bit-cell address range of the first bit-cell of each pair of bit-cells of the first group of paired-cell byte-subsets is discontiguous from a second bit-cell address range of the first bit-cell of each pair of bit-cells of the second group of paired-cell byte-subsets.

15. A method, comprising:

initiating fabrication of a first system on a chip (SoC) based on a first Graphic Design System Information Interchange (GDSII) chip layout file, the first GDSII chip layout file defining the first SoC as comprising a programmable read-only memory (ROM) circuit that includes:

multiple physically contiguous pairs of bit-cells, each pair of bit-cells including an active layer trace extending continuously across both of the bit-cells of the pair of bit-cells; and each pair of bit-cells comprising a contact layer point shared among the bit-cells in the pair when each bit-cell in the pair is programmed to a value of one and no contact layer point shared among the bit-cells in the pair when each bit-cell in the pair is programmed to a value of zero;

testing the first SoC;

in response to determining that firmware of the first SoC should be changed;

halting fabrication of the first SoC;

generating a new ROM image;

initiating generation of a second GDSII chip layout file defining a second SoC that differs from the first GDSII chip layout file at least in locations of the shared contact layer points of the pairs of bit-cells of the programmable ROM circuit in the first SoC and in the second SoC; and initiating fabrication of the second SoC based on the second GDSII chip layout file.

16. The method of claim 15, wherein the second SoC is fabricated from a partially fabricated first SoC that has not had a contact layer deposited in the programmable ROM circuit.

17. The method of claim 15, wherein the first and second GDSII chip layout files define:

a plurality of non-overlapping byte-subsets of the pairs of bit-cells, each byte-subset comprising n pairs of bit-cells;

an address circuit configured to address simultaneously a first bit-cell of each pair of bit-cells in a selected byte-subset; and a processor configured to read data simultaneously from the first bit-cell of each pair of bit-cells in the selected byte-subset.

18. The method of claim 17, wherein the first and second GDSII chip layout files define:

the pairs of bit-cells of at least one byte-subset as arranged in a column;

two or more of the plurality of byte-subsets as arranged in a row; and the active layer trace across both of the bit-cells of a first pair of bit-cells of a first byte-subset in the row as extending continuously across both of the bit-cells of a second pair of bit-cells of a second byte-subset in the row.

19. The method of claim 17, wherein the first and second GDSII chip layout files define the number n of pairs of bit-cells of each byte-subset as four.

20. The method of claim 17, wherein the first and second GDSII chip layout files define:
- the programmable ROM circuit as comprising a first group of paired-cell byte-subsets and a second group of paired-cell byte-subsets;
- the first bit-cell of each pair of bit-cells of the first group of paired-cell byte-subsets as having contiguous bit-cell addresses;
- the first bit-cell of each pair of bit-cells of the second group of paired-cell byte-subsets as having contiguous bit-cell addresses; and
- a first bit-cell address range of the first bit-cell of each pair of bit-cells of the first group of paired-cell byte-subsets discontiguous from a second bit-cell address range of the first bit-cell of each pair of bit-cells of the second group of paired-cell byte-subsets.

* * * * *